(12) United States Patent
Motoki et al.

(10) Patent No.: US 11,763,965 B2
(45) Date of Patent: Sep. 19, 2023

(54) OXIDE SUPERCONDUCTING THIN FILM MATERIAL, OXIDE SUPERCONDUCTING THIN FILM WIRE, AND METHOD FOR MANUFACTURING OXIDE SUPERCONDUCTING THIN FILM

(71) Applicant: Sumitomo Electric Industries, Ltd., Osaka (JP)

(72) Inventors: Takanori Motoki, Sagamihara (JP); Jun-ichi Shimoyama, Sagamihara (JP); Genki Honda, Osaka (JP); Tatsuoki Nagaishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1040 days.

(21) Appl. No.: 16/485,239

(22) PCT Filed: Oct. 31, 2017

(86) PCT No.: PCT/JP2017/039310
§ 371 (c)(1),
(2) Date: Aug. 12, 2019

(87) PCT Pub. No.: WO2018/163501
PCT Pub. Date: Sep. 13, 2018

(65) Prior Publication Data
US 2019/0371500 A1     Dec. 5, 2019

(30) Foreign Application Priority Data
Mar. 9, 2017 (JP) ................. 2017-044978

(51) Int. Cl.
*H01B 12/06*    (2006.01)
*C01G 1/02*    (2006.01)
(Continued)

(52) U.S. Cl.
CPC ............... *H01B 12/06* (2013.01); *C01G 1/02* (2013.01); *C01G 3/00* (2013.01); *H01B 13/00* (2013.01); *H10N 60/0632* (2023.02)

(58) Field of Classification Search
CPC .... H10N 60/0632; H01B 13/00; H01B 12/06; C01G 3/00; C01G 1/02
See application file for complete search history.

(56) References Cited

U.S. PATENT DOCUMENTS

| | | | | |
|---|---|---|---|---|
| 2005/0159298 | A1* | 7/2005 | Rupich | H01L 39/2483 502/100 |
| 2007/0111893 | A1* | 5/2007 | Kodenkandath | H01P 1/203 257/E39.018 |
| 2011/0015079 | A1* | 1/2011 | Yoo | H01L 39/2425 427/62 |

FOREIGN PATENT DOCUMENTS

| | | |
|---|---|---|
| CN | 1905955 A | 1/2007 |
| JP | 2000-322951 A | 11/2000 |

(Continued)

*Primary Examiner* — Paul A Wartalowicz
(74) *Attorney, Agent, or Firm* — Faegre Drinker Biddle & Reath LLP

(57) ABSTRACT

An oxide superconducting thin film material includes: a metal substrate having a surface with a biaxially oriented crystal orientation structure; an intermediate layer biaxially oriented and formed on the metal substrate; and an oxide superconducting thin film formed on the intermediate layer and composed of a RE123-based oxide superconductor represented by $REBa_2Cu_3O_y$. The oxide superconducting thin film includes Br (bromine).

4 Claims, 13 Drawing Sheets

(51) Int. Cl.
*C01G 3/00* (2006.01)
*H01B 13/00* (2006.01)
*H10N 60/01* (2023.01)

(56) References Cited

FOREIGN PATENT DOCUMENTS

| JP | 2012-174564 A | 9/2012 |
| JP | 2012-174565 A | 9/2012 |
| JP | 2013-122847 A | 6/2013 |
| JP | 2015-106521 A | 6/2015 |
| WO | WO 2005/081710 A2 | 9/2005 |

\* cited by examiner

OXIDE SUPERCONDUCTING THIN FILM MATERIAL, OXIDE SUPERCONDUCTING THIN FILM WIRE, AND METHOD FOR MANUFACTURING OXIDE SUPERCONDUCTING THIN FILM

TECHNICAL FIELD

The present invention relates to an oxide superconducting thin film material, an oxide superconducting thin film wire, and a method for manufacturing an oxide superconducting thin film.

The present application claims a priority based on Japanese Patent Application No. 2017-044978 filed on Mar. 9, 2017, the entire content of which is incorporated herein by reference.

BACKGROUND ART

In recent years, there has been developed an oxide superconducting thin film wire in which an oxide superconducting thin film is formed on a metal substrate. In the oxide superconducting thin film wire, the thin film, which is composed of an oxide superconductor such as a RE123-based oxide, is formed on the metal substrate, for example. The RE123-based oxide is represented by $REBa_2Cu_3O_y$, (RE: rare earth element; Ba: barium; Cu: copper; O: oxygen). In order to realize a high critical current density Jc, oxide superconductor crystals need to be oriented with biaxial orientations thereof being aligned.

One of methods for manufacturing such an oxide superconducting thin film is a metal organic decomposition (MOD) method. In the MOD method, the thin film is formed as follows: a source-material solution obtained by dissolving the respective organic acid salts of RE, Ba, and Cu is applied to a biaxially oriented metal substrate to form an applied film, and then sintering is performed to epitaxially grow an oxide superconductor. The MOD method is roughly divided into: a TFA-MOD (Metal Organic Decomposition using TrifluoroAcetates) method in which an organic metal salt including fluorine is used for a source-material solution; and a FF-MOD (Fluorine-free Metal Organic Deposition) method in which an organic metal salt including no fluorine is used for a source-material solution.

In order to improve Jc, in a magnetic field, of an oxide superconducting thin film formed using the FF-MOD method, for example, each of Japanese Patent Laying-Open No. 2012-174564 (Patent Literature 1) and Japanese Patent Laying-Open No. 2012-174565 (Patent Literature 2) discloses a technique for artificially forming a nano-sized magnetic flux pinning point (hereinafter, referred to as "pinning center") in the oxide superconductor so as to prevent motion of a nano-sized quantum magnetic flux entering the oxide superconductor under the magnetic field.

Moreover, in order to improve critical current Ic by increasing the film thickness of an oxide superconducting thin film formed using the FF-MOD method, for example, each of Japanese Patent Laying-Open No. 2013-122847 (Patent Literature 3) and Japanese Patent Laying-Open No. 2015-106521 (Patent Literature 4) discloses a technique for increasing the film thickness of an oxide superconducting thin film while excellently maintaining biaxial orientation of an oxide superconductor crystal by adding Cl (chlorine) to a source-material solution.

CITATION LIST

Patent Literature

PTL 1: Japanese Patent Laying-Open No. 2012-174564
PTL 2: Japanese Patent Laying-Open No. 2012-174565
PTL 3: Japanese Patent Laying-Open No. 2013-122847
PTL 4: Japanese Patent Laying-Open No. 2015-106521

SUMMARY OF INVENTION

An oxide superconducting thin film material according to the present disclosure includes: a metal substrate having a surface with a biaxially oriented crystal orientation structure; an intermediate layer biaxially oriented and formed on the metal substrate; and an oxide superconducting thin film formed on the intermediate layer and composed of a RE123-based oxide superconductor represented by $REBa_2Cu_3O_y$. The oxide superconducting thin film includes Br (bromine).

DETAILED DESCRIPTION

Figure 1:
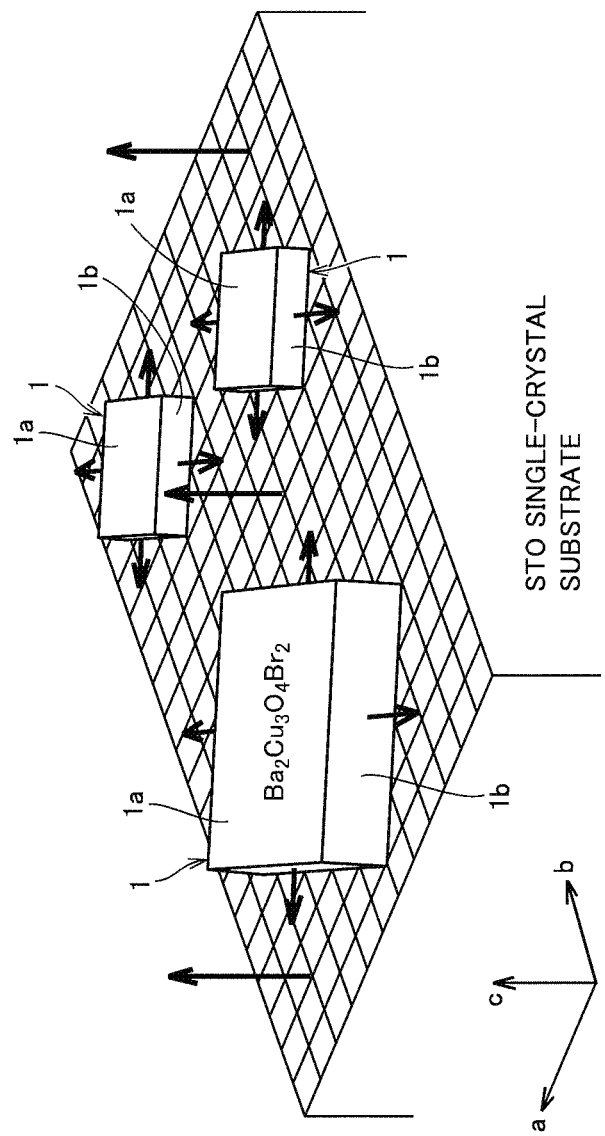
FIG. 1 is a perspective view schematically showing one embodiment of an oxide superconducting thin film formation base body used for an oxide superconducting thin film according to the present embodiment.

Problems to be Solved by the Present Disclosure

In Patent Literature 4, pinning centers are introduced into the oxide superconducting thin film by further adding an impurity such as Hf (hafnium) to the source-material solution in the FF-MOD method, thereby improving Jc in a magnetic field.

However, according to Patent Literature 4, if Hf is added in all the layers of the oxide superconducting thin film including the plurality of layers, the crystal orientation is deteriorated, with the result that the effect of improving Jc by the addition of Hf cannot be fully exhibited, disadvantageously. Therefore, there is room for improvement to attain both increased thickness of the oxide superconducting thin film and improvement of Jc.

The present invention has been made to solve the foregoing problem, and has an object to provide a technique for attaining both increased thickness of an oxide superconducting thin film and improvement of Jc in an oxide superconducting thin film material.

Advantageous Effect of the Present Disclosure

According to the present disclosure, there can be provided a technique for attaining both increased thickness of an oxide superconducting thin film and improvement of Jc in an oxide superconducting thin film material.

Description of Embodiments

First, embodiments of the present invention are listed and described.

(1) An oxide superconducting thin film material (see FIG. 2) according to one embodiment of the present invention includes: a metal substrate 2 having a surface with a biaxially oriented crystal orientation structure; an intermediate layer 3 biaxially oriented and formed on metal substrate 2; and an oxide superconducting thin film 4 formed on intermediate layer 3 and composed of a RE123-based oxide superconductor. Oxide superconducting thin film 4 includes Br.

In the oxide superconducting thin film material, by adding Br to the oxide superconducting thin film, Br can contribute to biaxial orientation growth of the oxide superconductor crystal and can contribute to introduction of pinning centers. This leads to attainment of both increased film thickness of the oxide superconducting thin film and improvement of Jc.

As indicated in Patent Literature 4, the present inventors have obtained the following knowledge: a deposit including Cl is formed in an oxide superconducting thin film by adding Cl to the oxide superconducting thin film, and this deposit assists biaxial orientation growth of an oxide superconductor crystal. As a result of further experiment and examination, the present inventors have found that the addition of Br to the oxide superconducting thin film provides higher effects of assisting the biaxial orientation growth and improving Jc than those in the case where Cl is added to the oxide superconducting thin film. This suggests that as compared with Cl, Br has a higher capability of assisting the biaxial orientation growth of the oxide superconductor crystal and allows a pinning center to be effectively introduced into the oxide superconducting thin film.

(2) Preferably in the oxide superconducting thin film material according to (1), oxide superconducting thin film 4 has a deposit formed on a surface of intermediate layer 3 or in the oxide superconducting thin film. The deposit includes Br.

Since the deposit including Br assists the biaxial orientation growth of the oxide superconductor crystal as described above, the biaxial orientation of the oxide superconductor crystal can be sufficiently maintained even in the case of an increased film thickness. Moreover, since this deposit also functions as a pinning center in formed oxide superconducting thin film 4, decrease of Jc in a magnetic field can be suppressed.

(3) Preferably in the oxide superconducting thin film material according to (2), the deposit includes a $Ba_2Cu_3O_4Br_2$ crystal 1 (Ba2342 crystal) (see FIG. 1).

Since Ba2342 crystal 1 formed on the biaxially orientated intermediate layer and deposited by epitaxial growth has substantially the same lattice constant as that of the RE123-based oxide superconductor crystal in an ab direction, the biaxial orientation of the oxide superconductor crystal can be excellently maintained. Moreover, after the growth of the RE123-based oxide superconductor crystal, the interface of the Ba2342 crystal therewith functions as a pinning center, whereby Jc in a magnetic field can be improved.

(4) Preferably in the oxide superconducting thin film material according to (3), $Ba_2Cu_3O_4Br_2$ crystal 1 (see FIG. 1) formed on the surface of intermediate layer 3 has an upper surface 1a and a side surface 1b that constitute a three-dimensional template assisting biaxial orientation growth of oxide superconducting thin film 4.

With this, by using the three-dimensional template having the Ba2342 crystal deposit, the oxide superconductor crystal is biaxially grown by not only the upper surface of the deposit but also the side surface of the deposit. As a result, even in the case of an increased film thickness, the biaxial orientation of the oxide superconductor crystal can be sufficiently maintained, whereby Ic can be improved according to the increased film thickness.

(5) Preferably, the oxide superconducting thin film material according to any one of (1) to (4) further includes a $BaMO_3$ nano particle formed in oxide superconducting thin film 4, where M represents an impurity metal. M is one of Hf (hafnium), Zr (zirconium), Sn (tin), Nb (niobium), Ir (iridium), Ti (titanium), Ce (cerium) and Bi (bismuth).

By adding both Br and M to the source-material solution, the Ba2342 crystal and the $BaMO_3$ nano particle can be formed in the formed oxide superconducting thin film. Since M has a characteristic of reducing a degree of crystal orientation, the orientation structure of the oxide superconducting thin film is likely to be varied when M is added to the oxide superconducting thin film to introduce a pinning center. However, in the present embodiment, since the Ba2342 crystal is generated before the growth of the oxide superconducting thin film, the film thickness can be increased while maintaining the excellent biaxial orientation structure even when the pinning center is introduced by adding M.

(6) An oxide superconducting wire 10 (see FIG. 2) according to one embodiment of the present invention includes: the oxide superconducting thin film material recited in any one of (1) to (5); and a coating layer (protective layer 5 and stabilization layer 6) that coats at least oxide superconducting thin film 4. With this, an oxide superconducting wire improved in Jc and Ic can be realized.

(7) A method for manufacturing an oxide superconducting thin film according to one embodiment of the present invention includes: preparing a metal substrate having a surface with a biaxially oriented crystal orientation structure; forming a biaxially oriented intermediate layer on the metal substrate; preparing a source-material solution for forming the RE123-based oxide superconductor, Br (bromine) being added to the source-material solution; applying the source-material solution onto the intermediate layer; and forming the oxide superconducting thin film on the intermediate layer by sintering the metal substrate on which the source-material solution is applied.

With this, by heating the source-material solution having Br added therein, a multiplicity of deposits each including Br are generated before the RE123-based oxide superconducting thin film is formed. By sintering the metal substrate, the oxide superconductor crystal is biaxially oriented and grown using the deposits. Accordingly, the film thickness of the oxide superconducting thin film can be increased while maintaining the biaxial orientation of the oxide superconductor crystal excellently. Moreover, by introducing the effective pinning centers, decrease of Jc in a magnetic field can be suppressed.

(8) Preferably in the method for manufacturing the oxide superconducting thin film according to (7), in the preparing of the source-material solution, an impurity metal is further added to the source-material solution. The impurity metal is one of Hf (hafnium), Zr (zirconium), Sn (tin), Nb (niobium), Ir (iridium), Ti (titanium), Ce (cerium) and Bi (bismuth).

By adding both Br and M to the source-material solution, the Ba2342 crystal and the $BaMO_3$ nano particle can be formed in the formed oxide superconducting thin film, whereby the film thickness of the oxide superconducting thin film can be increased and Jc can be improved.

(9) Preferably in the method for manufacturing the oxide superconducting thin film according to (8), the forming of the oxide superconducting thin film includes: performing calcination to remove a solvent component from the source-material solution by thermally decomposing the source-material solution; and forming the oxide superconducting thin film by sintering the metal substrate having been through the calcination. A calcinated film having a plurality of layers is formed on the intermediate layer by alternately and repeatedly performing the applying of the source-material solution and the performing of the calcination. The impurity metal is added to each of second and later layers of the plurality of layers of the calcinated film.

With this, the film thickness of the oxide superconducting thin film can be increased while maintaining the biaxial orientation structure of the oxide superconductor crystal and effective pinning centers can be introduced into the oxide superconducting thin film. Therefore, Ic and Jc can be improved.

(10) Preferably in the method for manufacturing the oxide superconducting thin film according to (9), the impurity metal is further added to a first layer of the plurality of layers of the calcinated film.

The present inventors have found that unlike a case where Cl is added to the oxide superconducting thin film, in the case where Br is added to the oxide superconducting thin film, the orientation structure of the oxide superconducting thin film is not varied even when M is further added to the first layer. Accordingly, Ic and Jc can be further improved as compared with a case where M is added to the second and later layers.

(11) Preferably in the method for manufacturing the oxide superconducting thin film according to any one of (7) to (10), the source-material solution is an organic metal compound solution including no fluorine.

As the MOD method applied in the embodiment of the present invention, either of the TFA-MOD method and the FF-MOD method may be employed; however, the effect of the present invention can be exhibited more significantly when the FF-MOD method is applied because no hydrofluoric acid is generated and a high-quality oxide superconductor crystal can be generated in a short time.

Details of Embodiments of the Present Invention

The following describes an embodiment of the present invention based on figures. It should be noted that in the below-mentioned figures, the same or corresponding portions are given the same reference characters and are not described repeatedly.

(1) OXIDE SUPERCONDUCTING FILM FORMATION BASE BODY

FIG. 1 is a perspective view schematically showing a surface portion of an oxide superconducting thin film formation base body according to an embodiment. It should be noted that in the specification of the present application, a YBCO oxide superconducting thin film represented by $YBa_2Cu_3O_y$, is used as a RE123-based oxide superconducting thin film. Moreover, as a substrate (two-dimensional template) having a biaxially oriented crystal orientation structure, a STO ($SrTiO_3$: strontium titanate) single-crystal substrate is used.

As shown in FIG. 1, a multiplicity of deposits are formed on the STO single-crystal substrate. Each of these deposits includes Br (bromine). In FIG. 1, each of the deposits is formed on a surface of the STO single-crystal substrate in the form of a prism.

Each of these deposits includes a $Ba_2Cu_3O_4Br_2$ crystal 1 (Ba2342 crystal). The deposit is formed by depositing Ba2342 crystal 1 on the STO single-crystal substrate in a c axis direction.

Ba2342 crystal 1 has substantially the same lattice constant as that of the RE123-based oxide superconductor crystal in an ab direction and permits biaxial orientation growth on upper surface 1a and side surface 1b of Ba2342 crystal 1. Accordingly, when forming the oxide superconducting thin film, the oxide superconducting thin film is not only biaxially oriented and grown from the ab plane in directions indicated by arrows parallel to the surface of the STO single-crystal substrate and is but also biaxially oriented and grown in the c axis direction, i.e., a direction indicated by upward arrows.

In this way, Ba2342 crystal 1 serves as a three-dimensional template to assist the biaxial orientation growth of the oxide superconducting thin film not only in the ab plane but also in the c axis direction. Hence, even when the film thickness is increased, the excellent biaxial orientation structure can be maintained.

For example, the three-dimensional template is formed by adding Br (bromine) to a source-material solution for forming the oxide superconducting thin film and heating it. Ba2342 crystal 1 is deposited as a result of epitaxial growth from the surface of the STO single-crystal substrate in the c axis direction at a lower temperature than a temperature at which the YBCO oxide superconductivity crystal is grown. Therefore, when forming the oxide superconducting thin film, Ba2342 crystal 1 functions as a template to biaxially orient and grow the oxide superconducting thin film not only in the ab plane but also in the c axis direction. It should be noted that for example, Br can be added by adding HBr (hydrobromic acid) to the source-material solution.

It is preferable that a ratio of the rare earth element (for example, Y), Ba, Cu, and Br in the source-material solution is Y:Ba:Cu:Br=1:2+x:3+1.5x:x, where $0.05 \le x \le 0.20$. Accordingly, in the formation of the three-dimensional template, the Ba2342 crystal can be sufficiently formed and the YBCO oxide superconductor crystal can be biaxially oriented and grown. It should be noted that if x>0.20, when HBr is mixed with the source-material solution, HBr may be settled and may not be completely dissolved. On the other hand, if x<0.05, the effect of adding Br cannot be significantly exhibited. If x=0.02, the effect is hardly seen.

The Ba2342 crystal serves as a pinning center in the YBCO oxide superconducting film. Further, even when an impurity metal, which conventionally causes decrease in a degree of orientation of the oxide superconducting thin film, such as Hf (hafnium), Sn (tin), or Zr (zirconium), is added, the crystal orientation structure can be maintained. Therefore, even when the impurity metal is added to introduce further pinning centers, the biaxial orientation growth of the YBCO oxide superconductor crystal is not hindered.

As a result, there can be obtained an oxide superconducting thin film that has an increased film thickness while excellently maintaining the biaxial orientation of the oxide superconductor crystal and that has effective pinning centers introduced to improve Jc in a magnetic field.

Under a condition of $O_2$ partial pressure ($PO_2$) of 10 Pa in an $O_2$/Ar gas flow under a pressure of 1 atmosphere, the Ba2342 crystal is generated at more than or equal to 550° C. and is substantially evaporated at 840° C. 550° C. is a temperature lower than a temperature (about 580° C.) at which $BaCuO_2$, which is one of precursors of the RE123-based oxide superconductor crystal, is generated. Moreover, 840° C. is a temperature higher than a sintering temperature (about 800° C.) at which the RE123-based oxide superconductor crystal is grown. Therefore, the formed Ba2342 crystal is not evaporated when performing sintering to grow the RE123-based oxide superconductor crystal, the RE123-based oxide superconductor crystal can be biaxially oriented and grown using the upper surface and side surface of the Ba2342 crystal, and the pinning centers can be introduced efficiently.

It should be noted that for the metal substrate having the biaxially oriented crystal orientation structure, a SUS/Cu/Ni cladding substrate with Ni (nickel) being disposed at the front side or the like can be used. For the metal substrate, an IBAD (Ion Beam Assisted Deposition) substrate, a Ni—W (tungsten) alloy substrate, or the like may be used. The metal substrate preferably has a long shape (tape-like shape) having a rectangular cross section.

Moreover, as the biaxially oriented intermediate layer formed on the surface of the metal substrate, a known thin film can be used such as STO or an intermediate layer having a three-layer structure of $CeO_2$ (cerium oxide)/YSZ (yttria stabilized zirconia)/$CeO_2$.

(2) FORMATION OF OXIDE SUPERCONDUCTING THIN FILM

The oxide superconducting thin film is preferably formed using the FF-MOD method. For the source-material solution, a source-material solution having Br added therein is preferably used. Examples of such a source-material solution include an alcohol solution, such as a methanol solution, that contains predetermined ratio and predetermined concentrations of the organic acid salts of RE, Ba and Cu and that has a predetermined amount of HBr added therein. Examples of RE include Y (yttrium), Gd (gadolinium), Ho (holmium), and the like.

It should be noted that in order to increase the film thickness of the oxide superconducting thin film, the following method can be employed: application of the source-material solution and calcination are repeatedly and alternately performed to form a thick calcinated film, and then the sintering is performed to form a plurality of stacked layers.

Moreover, although the interface of the Ba2342 crystal with the RE123-based oxide superconductor crystal functions as a pinning center, the function of pinning only by the Ba2342 crystal may be insufficient depending on a purpose of use. For example, in this case, by further adding an impurity metal to the source-material solution having Br added therein, further pinning centers can be introduced. Accordingly, the pinning center introduction effect can be improved.

It should be noted that for the impurity metal, any one of Zr (zirconium), Hf (hafnium), Sn (tin), Ni (niobium), Ir (iridium), Ti (titanium), Ce (cerium) and Bi (bismuth) can be used. As an amount of addition of the impurity metal, 0.5 to 1.5 mol % is preferable and about 1 mol % is particularly preferable. Accordingly, a multiplicity of fine deposits of less than or equal to 20 nm and a multiplicity of stacking faults are generated to function as pinning centers, whereby Jc in a magnetic field is improved significantly.

(3) OXIDE SUPERCONDUCTING WIRE

The oxide superconducting thin film material obtained by forming the oxide superconducting thin film as described above on the oxide superconducting thin film formation base body can attain increased Ic according to the increased film thickness. Moreover, decrease of Jc in a magnetic field can be suppressed. Therefore, an oxide superconducting thin film wire formed using this oxide superconducting thin film material can realize excellent superconducting properties.

Figure 2:
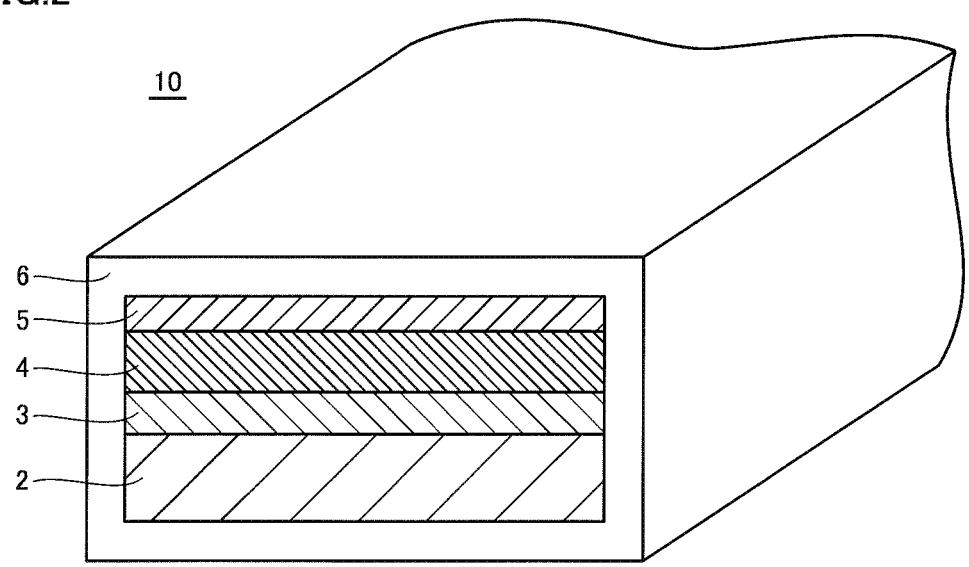
FIG. 2 is a cross sectional view schematically showing a configuration of an oxide superconducting wire according to the present embodiment.

FIG. 2 is a cross sectional view schematically showing a configuration of an oxide superconducting wire 10 formed using the oxide superconducting thin film material according to the present embodiment. FIG. 2 shows a cross section taken in a direction crossing a direction in which oxide superconducting wire 10 extends. Hence, a direction crossing a plane of sheet is the longitudinal direction of oxide superconducting wire 10, and supercurrent of oxide superconducting thin film 4 flows along the direction crossing the plane of sheet.

As shown in FIG. 2, oxide superconducting wire 10 has a long shape (tape-like shape) having a rectangular cross section and includes a metal substrate 2, an intermediate layer 3, an oxide superconducting thin film 4, a protective layer 5, and a stabilization layer 6.

In manufacturing oxide superconducting wire 10, intermediate layer 3 and oxide superconducting thin film 4 are formed on metal substrate 2 having a tape-like shape, protective layer 5 is then formed on the surface of oxide superconducting thin film 4, then they are slit into a predetermined width, and stabilization layer 6 is formed to surround them. Protective layer 5 is preferably composed of a material such as Ag (silver) or an Ag alloy, for example. Stabilization layer 6 is preferably composed of a material such as Cu (copper) or a copper alloy, for example. Each of protective layer 5 and stabilization layer 6 corresponds to one example of the "coating layer". Protective layer 5 and stabilization layer 6 may be formed to cover at least the upper main surface of oxide superconducting thin film 4.

(4) EXAMPLES

In each example described below, the FF-MOD method was used to produce a YBCO oxide superconducting thin film.

<Experiment 1> (Formation of Ba2342 Crystal)

In an Experiment 1, as an Example, a YBCO oxide superconducting thin film was formed on a STO single-crystal substrate using a source-material solution having Br added therein. Moreover, as a Comparative Example, a YBCO oxide superconducting thin film was formed on a STO single-crystal substrate using a source-material solution having no Br added therein. Each of the YBCO oxide superconducting thin films was sintered at 800° C. for 60 min under $PO_2$=10 Pa.

The structure of the formed YBCO oxide superconducting thin film can be checked by observing surface and cross section of the formed YBCO oxide superconducting thin film using a scanning electron microscope (SEM), a transmission electron microscope (TEM), or a scanning transmission electron microscope (STEM).

Figure 3A:
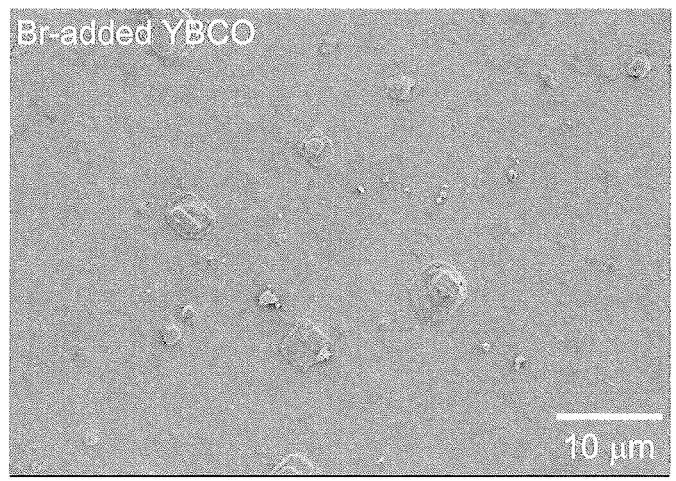
FIG. 3A shows a SEM image of a surface of a YBCO oxide superconducting thin film according to an Example.
Figure 3B:
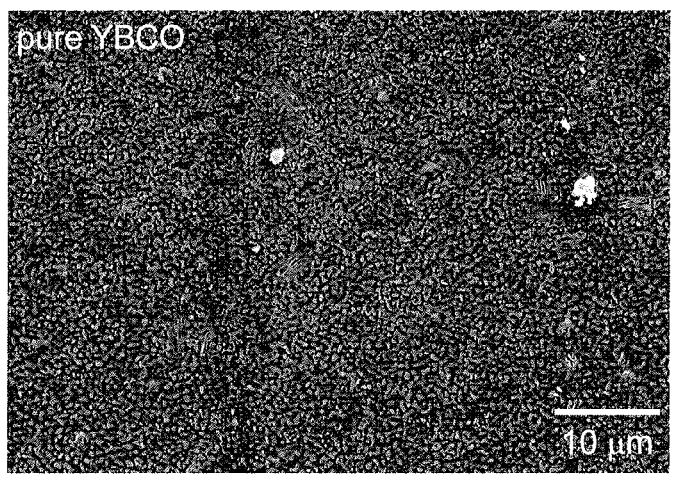
FIG. 3B shows a SEM image of a surface of a YBCO oxide superconducting thin film according to a Comparative Example.

For respective surfaces of the YBCO oxide superconducting thin films, SEM images shown in FIG. 3A and FIG. 3B were obtained. FIG. 3A shows a SEM image of a surface of the YBCO oxide superconducting thin film according to the Example, whereas FIG. 3B shows a SEM image of a surface of the YBCO oxide superconducting thin film according to the Comparative Example.

When Br is not added in the source-material solution (FIG. 3B), fine irregularities were observed on the surface of the STO single-crystal substrate. On the other hand, when Br is added in the source-material solution (FIG. 3A), the surface of the STO single-crystal substrate has decreased fine irregularities and is smooth. Moreover, it was confirmed that a multiplicity of Ba2342 crystals were formed on the surface of the STO single-crystal substrate. It is presumed that parts of these Ba2342 crystals have substantially prismatic shapes and these constitute the three-dimensional templates shown in FIG. 1.

Figure 4A:
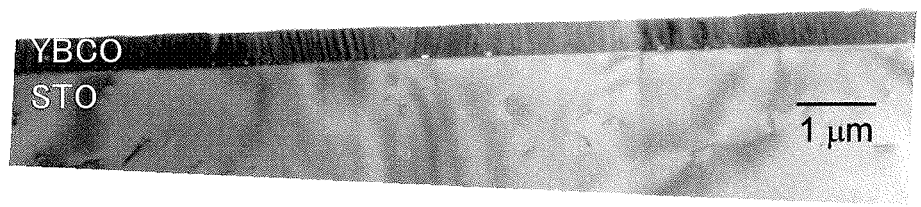
FIG. 4A shows a cross-sectional TEM image of the YBCO oxide superconducting thin film according to the Example.
Figure 4B:
FIG. 4B shows a cross-sectional STEM image of the YBCO oxide superconducting thin film according to the Comparative Example.

Moreover, a cross section of each YBCO oxide superconducting thin film was observed. Results of the observation are shown in FIG. 4A and FIG. 4B. FIG. 4A shows a cross-sectional TEM image of the YBCO oxide superconducting thin film according to the Example, and FIG. 4B shows a cross-sectional STEM image of the YBCO oxide superconducting thin film according to the Comparative Example.

With reference to FIG. 4B, when Br was not added in the source-material solution, it was confirmed that a multiplicity of voids were generated in the YBCO oxide superconducting thin film and the crystal orientation was varied. On the other hand, with reference to FIG. 4A, when Br was added in the source-material solution, it was confirmed that generation of voids in the YBCO oxide superconducting thin film was suppressed and a homogeneous and flat thin film was formed.

It should be noted that in FIG. 4A, it was observed that an impurity considered to be the Ba2342 crystal existed at an interface between the YBCO oxide superconducting thin film and the STO single-crystal substrate. It should be noted that this impurity was also observed in the YBCO oxide superconducting thin film.

Figure 5:
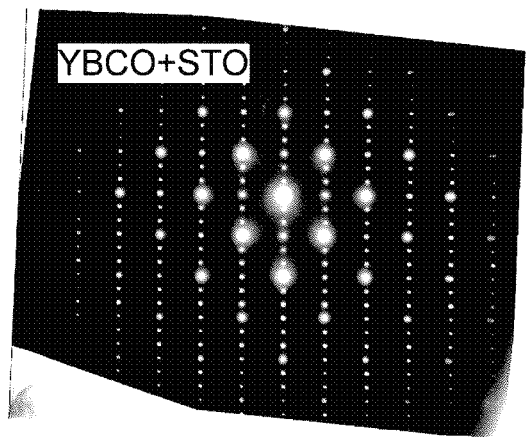
FIG. 5 shows an electron diffraction image of the YBCO oxide superconducting thin film according to the Example.

FIG. 5 shows a result of observing a cross section of the YBCO oxide superconducting thin film according to the Example using an electron diffractograph. The electron diffraction image shown in FIG. 5 shows a portion including the YBCO oxide superconducting thin film and the STO single-crystal substrate. With reference to FIG. 5, it was confirmed that the orientation of the YBCO oxide superconducting thin film and the orientation of the STO single-crystal substrate coincided with each other and they were oriented in the c axis. Moreover, in the electron diffraction image, an annular diffraction line resulting from non-orientation grains or impurity was not observed.

Figure 6:
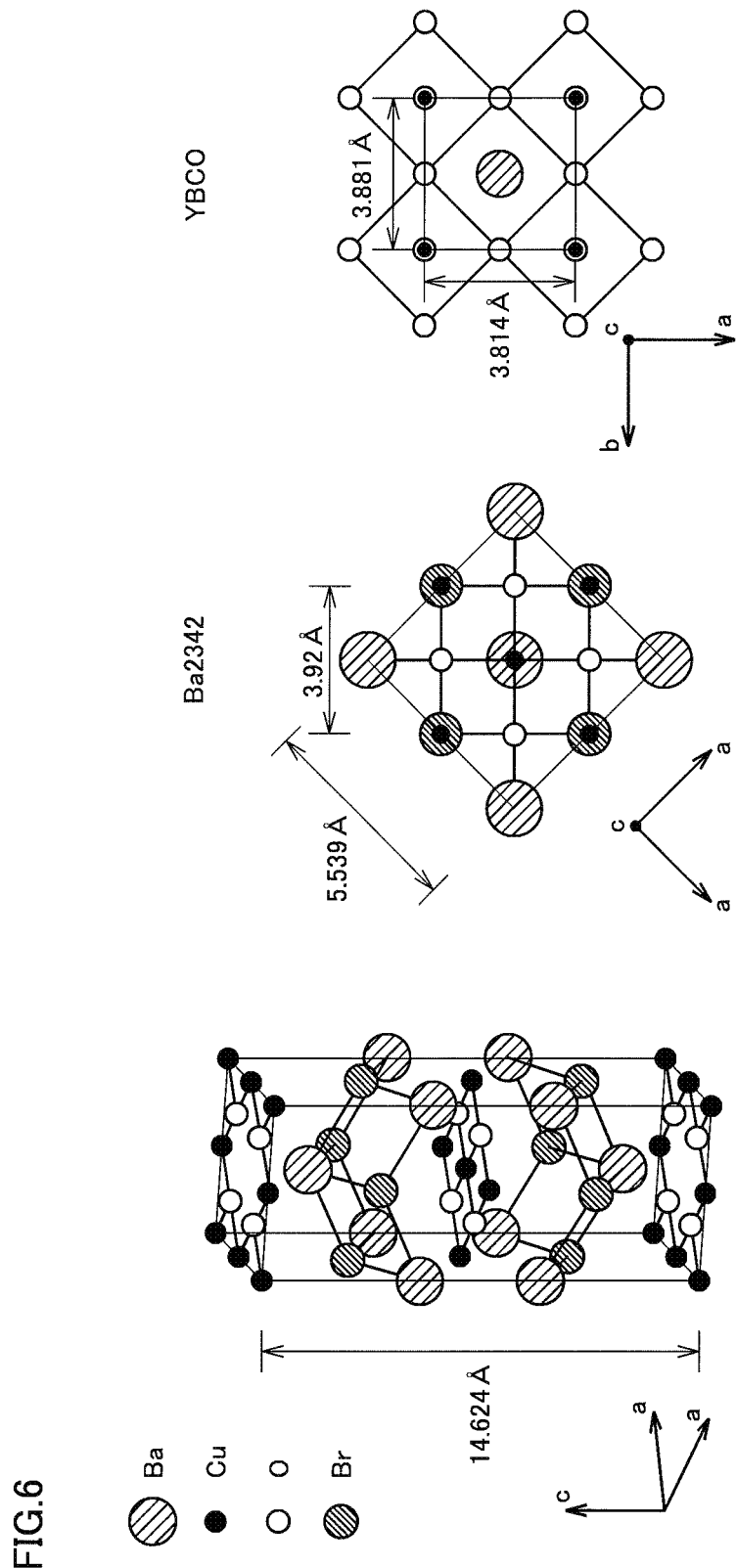
FIG. 6 shows crystal structures of a Ba2342 crystal and a YBCO oxide superconducting crystal.

FIG. 6 shows crystal structures of the Ba2342 crystal and the YBCO oxide superconducting crystal. Each of the left side and center of FIG. 6 shows the crystal structure of the Ba2342 crystal, whereas the right side of FIG. 6 shows the crystal structure of the YBCO oxide superconducting crystal.

The Ba2342 crystal is a tetragonal crystal and has the following axial lengths: a=b=5.539 Å. The axial lengths of the YBCO oxide superconducting crystal are as follows: a=3.814 Å and b=3.881 Å. Although the Ba2342 crystal has a larger lattice misfit than that of the YBCO oxide superconducting crystal, a tetragonal lattice formed by Br atoms has one side of 3.92 Å as shown in the illustration at the center of the figure and very excellently coincide with that of the YBCO oxide superconducting crystal. Presumably due to this, the orientation was hardly varied.

<Experiment 2> (Evaluation of Ba2342 Crystal)

In an Experiment 2, a YBCO oxide superconducting thin film having a three-layer configuration and having a film thickness of up to 0.4 μm was formed on a STO single-crystal substrate having a size of 10×10 mm, and pinning centers constituted of Ba2342 crystals were attempted to be introduced into the YBCO oxide superconducting thin film.

Figure 7:
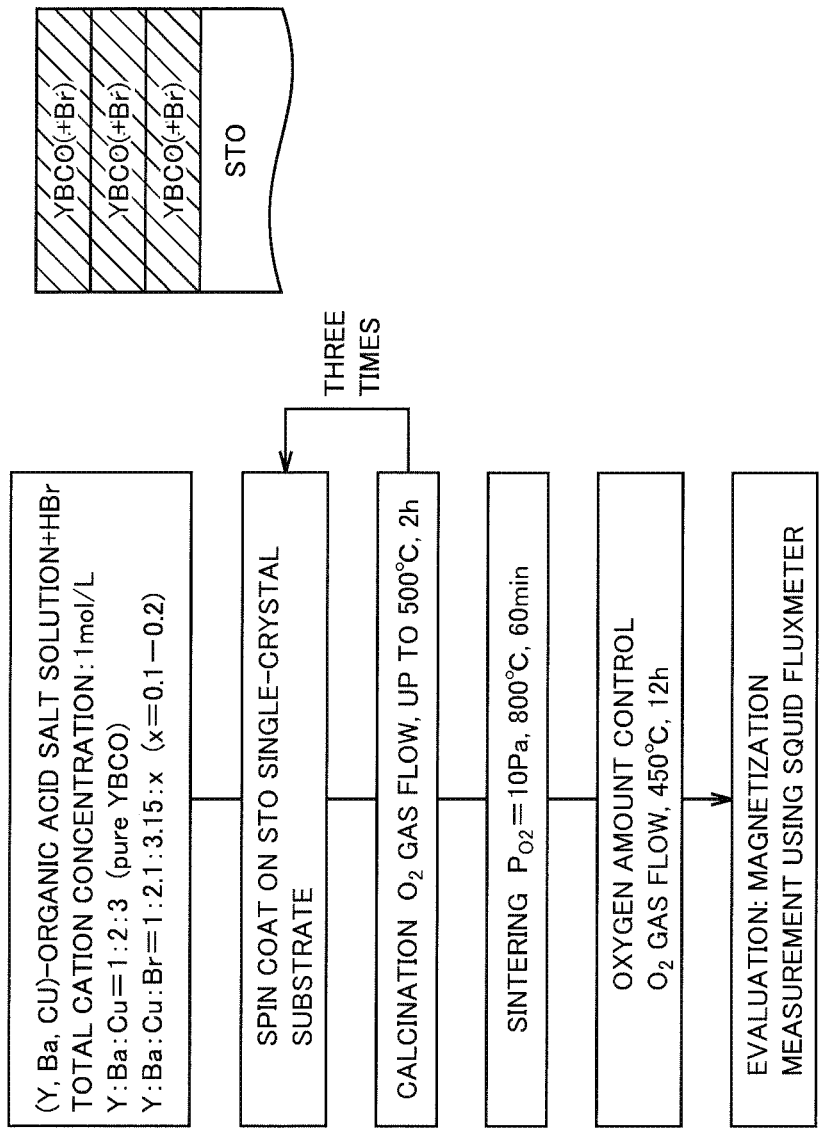
FIG. 7 illustrates a process procedure of an oxide superconducting thin film formation step.

FIG. 7 shows a method in the present experiment. The illustration at the left side of FIG. 7 is a flowchart showing a procedure of the present experiment. The illustration of the right side of FIG. 7 shows a cross sectional view schematically showing the configuration of the YBCO oxide superconducting thin film having three stacked layers.

The method for manufacturing the oxide superconducting thin film according to the present embodiment mainly includes: a substrate preparing step; an intermediate layer formation step of forming an intermediate layer on a metal substrate; and an oxide superconducting thin film formation step. In the substrate preparing step, metal substrate 2 having a surface with a biaxially oriented crystal orientation structure is prepared. In the intermediate layer formation step, biaxially oriented intermediate layer 3 is formed on the metal substrate. In the present experiment, a STO single-crystal substrate having a STO layer formed on metal substrate 2 is prepared.

FIG. 7 shows a process procedure of the oxide superconducting thin film formation step. The oxide superconducting thin film formation step mainly includes an applied film formation step, a calcination step, a sintering step, and an oxygen introduction step.

(1) Applied Film Formation Step

In the applied film formation step, a non-fluorine-based source-material solution was applied to the surface of the intermediate layer and was then dried to form an applied film having a predetermined thickness. The non-fluorine-based source-material solution refers to a non-fluorine-based organic metal salt solution of RE, Ba and Cu.

In the present experiment, for the source-material solution, a (Y, Ba, Cu)-organic acid salt solution having a total cation concentration of 1 mol/L was used. In the source-material solution, a ratio of the components as follows: Y:Ba:Cu:Br=1:2.1:3.15:x. HBr was added in the following four levels: x=0, 0.10, 0.15, and 0.20. Each of the produced source-material solutions of the four levels was applied to the surface of the STO single-crystal substrate by way of spin coat.

(2) Calcination Step

In the calcination step, the solvent component and the like are removed from the applied film, which is a precursor. Specifically, the STO single-crystal substrate having the applied film formed thereon was heated and held for a certain time in an atmospheric air within a temperature range of more than or equal to 400° C. and less than or equal to 600° C., for example, at 500° C. The holding time is about 2 hours. On this occasion, the applied organic metal salt solution is thermally decomposed. Moreover, $CO_2$ (carbon dioxide) and $H_2O$ (water) are separated, thereby removing the solvent component and the like from the organic metal salt solution. Accordingly, the calcinated film, which is a precursor, is formed. In the present experiment, by repeatedly and alternately performing the applied film formation step and the calcination step three times, a calcinated film having three layers was formed.

(3) Sintering Step

In the sintering step, the calcinated film is crystallized to form a sintered film. In the present experiment, the sintering was performed at 800° C. for 60 min under $PO_2$=10 Pa. As a result of epitaxial crystal growth from the calcinated film, a sintered film having YBCO oxide superconductor crystals oriented in the c axis is formed.

(4) Oxygen Introduction Step

In the oxygen introduction step, heat treatment for introducing oxygen into the formed sintered film is performed. Specifically, for example, the atmospheric gas is changed to a gas with an oxygen concentration of 100% under a pressure of 1 atmosphere, holding is performed for 12 hours with the maximum heating temperature being set to 450° C. while maintaining this oxygen concentration, and then the furnace is opened for rapid cooling. In this way, the YBCO oxide superconducting thin film is formed.

Next, in order to find an influence of the addition of Br over a critical temperature Tc, a magnetic susceptibility $\chi$ was measured while gradually increasing the temperature of the produced YBCO oxide superconducting thin film from 80K under a zero magnetic field (ZFC) so as to measure a temperature dependency of magnetic susceptibility $\chi$. Results of the measurement are shown in FIG. 8.

Figure 8:
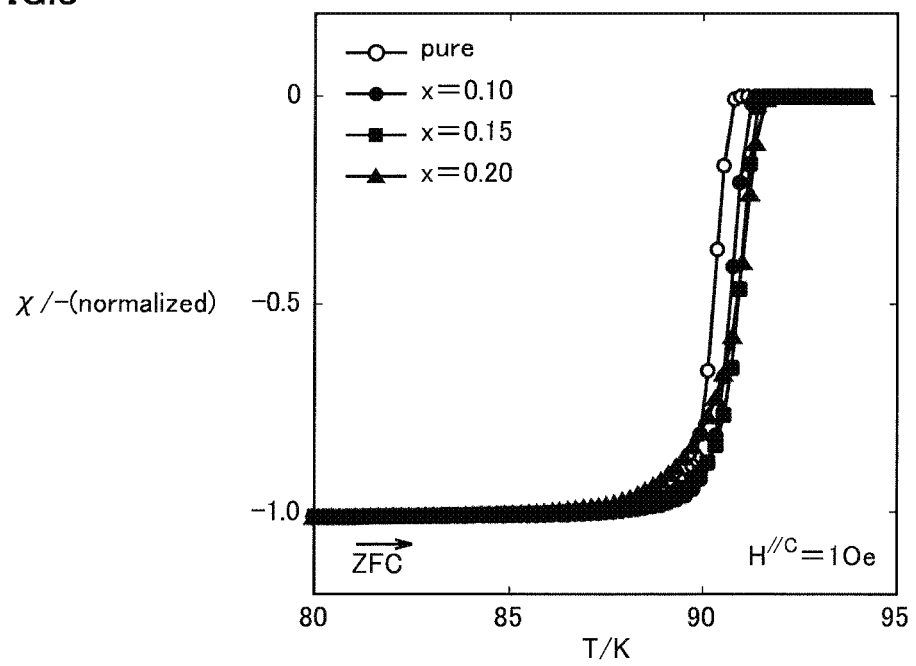
FIG. 8 shows a temperature dependency of a magnetic susceptibility of the YBCO oxide superconducting thin film.

In FIG. 8, the vertical axis represents magnetic susceptibility $\chi$ (normalized), and the horizontal axis represents the temperature (K). "x" is the one shown in the following ratio: Y:Ba:Cu:Br=1:2.1:3.15:x. Moreover, "pure" indicates that no Br is added (i.e., x=0).

With reference to FIG. 8, it was confirmed that the temperature dependency of magnetic susceptibility $\chi$ was substantially unchanged between the case where no Br was added (x=0) and the cases where Br was added (x=0.10, 0.15, and 0.20) and Tc was unchanged.

Next, at 77 K and 40 K, magnetic field dependency of critical current density Jc was measured. Results of the measurement are shown in FIG. 9.

Figure 9:
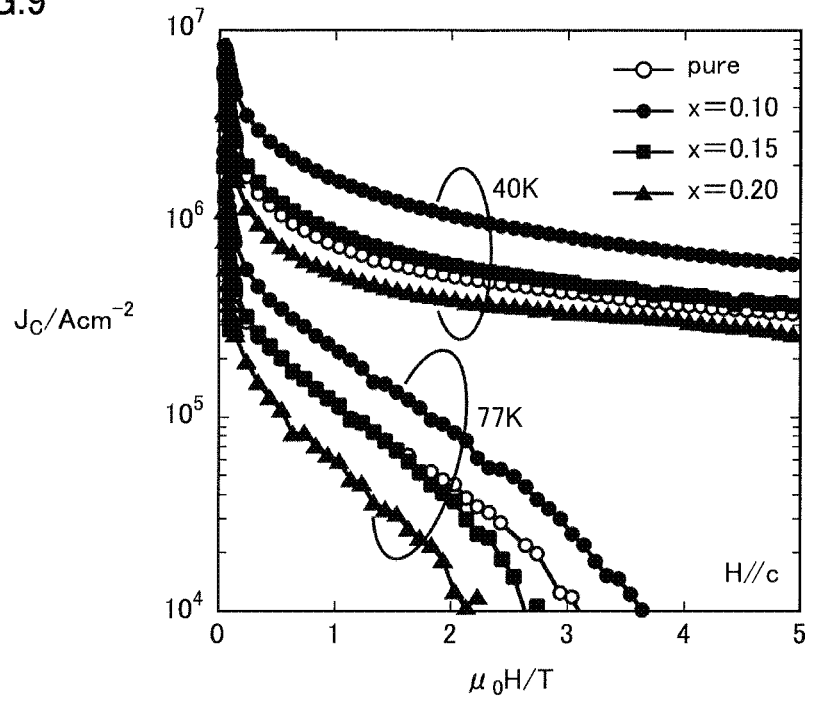
FIG. 9 shows an evaluation result of a magnetic field dependency of Jc of the YBCO oxide superconducting thin film.

In FIG. 9, the vertical axis represents critical current density Jc ($Acm^{-2}$), and the horizontal axis represents $\mu_0H$ (T). "x" is the one shown in the following ratio: Y:Ba:Cu:Br=1:2.1:3.15:x. Moreover, "pure" indicates that no Br is added (i.e., x=0).

With reference to FIG. 9, it was confirmed that at each of the temperatures of 40 K and 70 K, higher Jc was obtained in the case where x=0.10 than that in the case where Br was not added (x=0). This is presumably due to the following reason: because the addition of Br causes formation of the three-dimensional templates constituted of the Ba2342 crystals (see FIG. 1), the excellent biaxial orientation structure of the YBCO oxide superconducting thin film is maintained and the three-dimensional templates function as pinning centers.

However, with reference to FIG. 9, Jc in the case where x=0.15 is not greatly different from that in the case where no Br is added. Moreover, Jc in the case where x=0.20 is lower than that in the case where no Br is added. This is presumably due to the following reason: as the amount of addition of Br is increased to be more than x=0.10, it becomes more difficult to suppress non-orientation grain growth, with the result that the degree of crystal orientation is decreased.

<Experiment 3> (Addition of Br and M)

Next, by adding both Br and impurity metal M to the source-material solution, $BaMO_3$ nano particles were attempted to be introduced into the YBCO oxide superconducting thin film. Zr, Hf, and Sn were used as impurity metal M. Moreover, in each of the Examples, the amount of addition of M to the source-material solution was 1 mol %.

Specifically, a YBCO oxide superconducting thin film constituted of three layers, having a film thickness of 0.4 μm, and having a film composition of $YBa_{2.1}Cu_{3.15}M_2Br_{0.1}O_y$, was sintered at 800° C. for 60 min under $PO_2$=10 Pa. In the following description, the respective three layers of the YBCO oxide superconducting thin film will be also referred to as a first layer, a second layer, and a third layer from the STO single-crystal substrate side. It should be noted that an average film composition when Br and M are added to the second layer and the third layer is $YBa_{2.1}Cu_{3.15}M_{0.007}Br_{0.1}O_y$, and an average film composition when Br and M are added to the first to third layers is $YBa_{2.1}Cu_{3.15}M_{0.01}Br_{0.1}O_y$.

In Examples 1 to 3, the following respective YBCO oxide superconducting thin films were produced: a YBCO oxide superconducting thin film in which Br and Zr were added to the second and third layers (Example 1); a YBCO oxide superconducting thin film in which Br and Sn were added to the second and third layers (Example 2); and a YBCO oxide superconducting thin film in which Br and Hf were added to the second and third layers (Example 3).

On the other hand, in Examples 4 to 6, the following respective YBCO oxide superconducting thin films were produced: a YBCO oxide superconducting thin film in which Br and Zr were added to the first to third layers (Example 4); a YBCO oxide superconducting thin film in which Br and Sn were added to the first to third layers (Example 5); and a YBCO oxide superconducting thin film in which Br and Hf were added to the first to third layers (Example 6).

Each of the produced YBCO oxide superconducting thin films according to Examples 1 to 6 was subjected to X-ray diffraction (XRD) measurement.

Figure 10A:
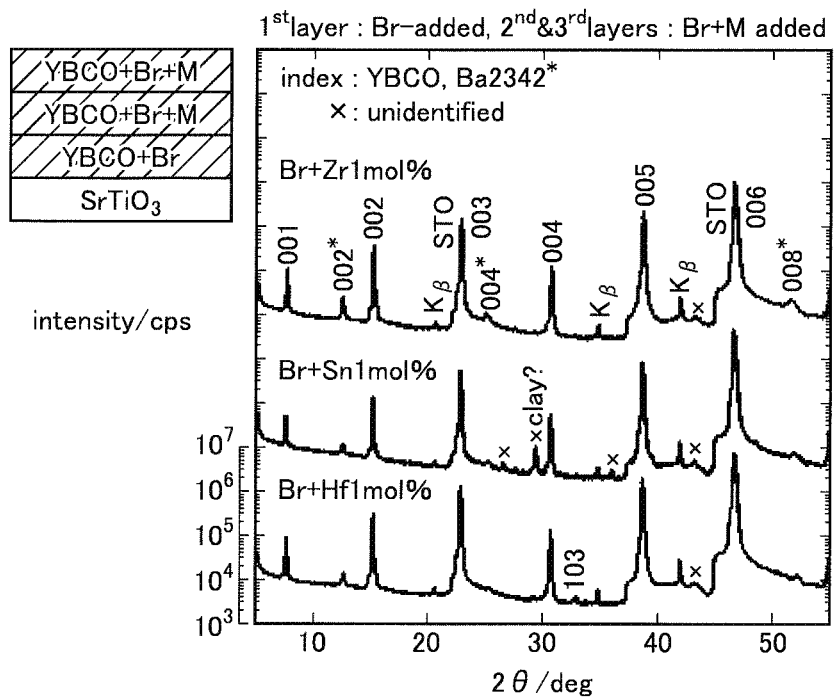
FIG. 10A shows respective XRD patterns of YBCO oxide superconducting thin films according to Examples 1 to 3.
Figure 10B:
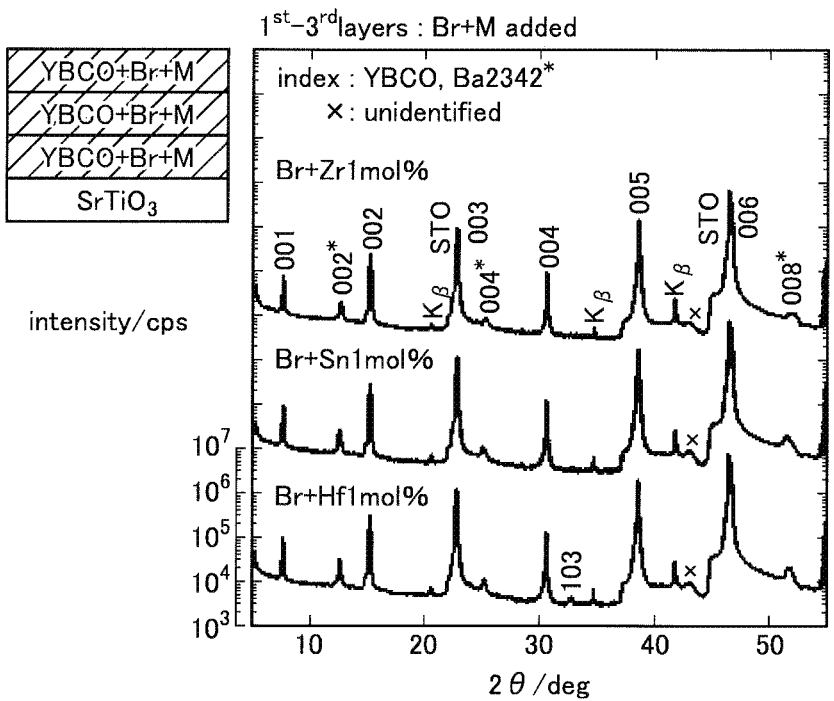
FIG. 10B shows respective XRD patterns of YBCO oxide superconducting thin films according to Examples 4 to 6.

FIG. 10A and FIG. 10B show respective XRD patterns of the produced YBCO oxide superconducting thin films according to Examples 1 to 6. In FIG. 10A and FIG. 10B, the vertical axis represents diffraction intensity (cps) and the horizontal axis represents 2θ (deg). FIG. 10A shows the respective XRD patterns of the YBCO oxide superconducting thin films according to Examples 1 to 3, and FIG. 10B shows the respective XRD patterns of the YBCO oxide superconducting thin films according to Examples 4 to 6.

With reference to FIG. 10A, it is understood that the crystal orientation was not varied in each of the following cases: the case where Br and Zr were added to the second and third layers (Example 1); the case where Br and Sn were added to the second and third layers (Example 2); and the case where Br and Hf were added to the second and third layers (Example 3). With reference to FIG. 10B, it is understood that the crystal orientation was not varied in each of the following cases: the case where Br and Zr were added to the first to third layers (Example 4); the case where Br and Sn were added to the first to third layers (Example 5); and the case where Br and Hf were added to the first to third layers (Example 6).

Further, in comparison between FIG. 10A and FIG. 10B, it was confirmed that the crystal orientation was not varied even when M was added to the first layer. Moreover, by adding M to the first layer, it was confirmed that the peak of the (103) plane of YBCO was hardly seen.

Next, magnetic susceptibility $\chi$ of each of the YBCO oxide superconducting thin films according to Examples 1 to 6 was measured under a zero magnetic field (ZFC) while gradually increasing the temperature from 80 K so as to measure a temperature dependency of magnetic susceptibility $\chi$ in each YBCO oxide superconducting thin film. Results of the measurement are shown in FIG. 11A and FIG. 11B.

Figure 11A:
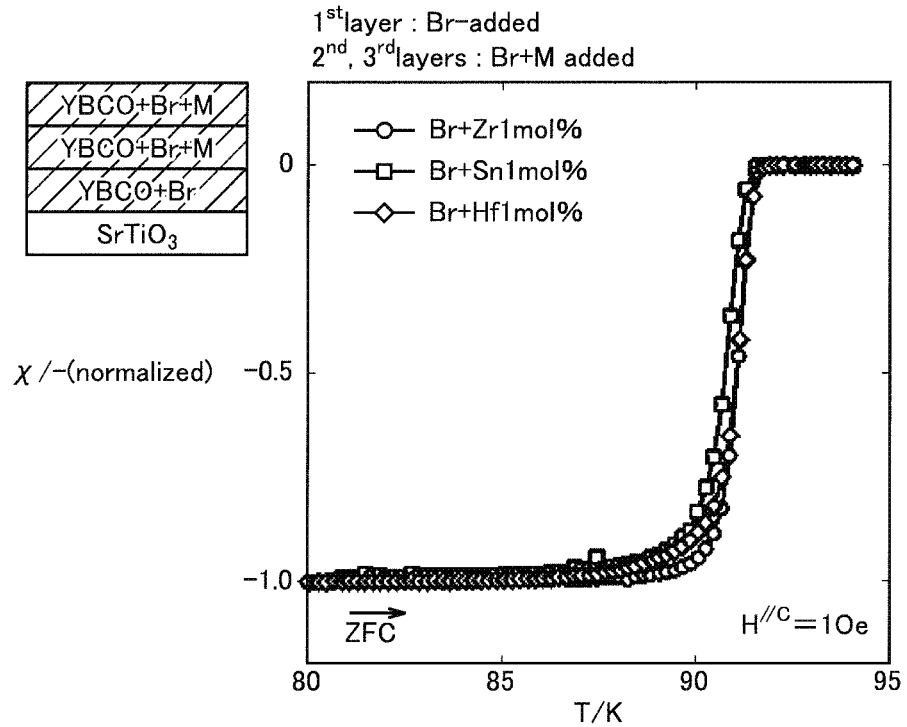
FIG. 11A shows a temperature dependency of a magnetic susceptibility in the YBCO oxide superconducting thin film according to each of Examples 1 to 3.
Figure 11B:
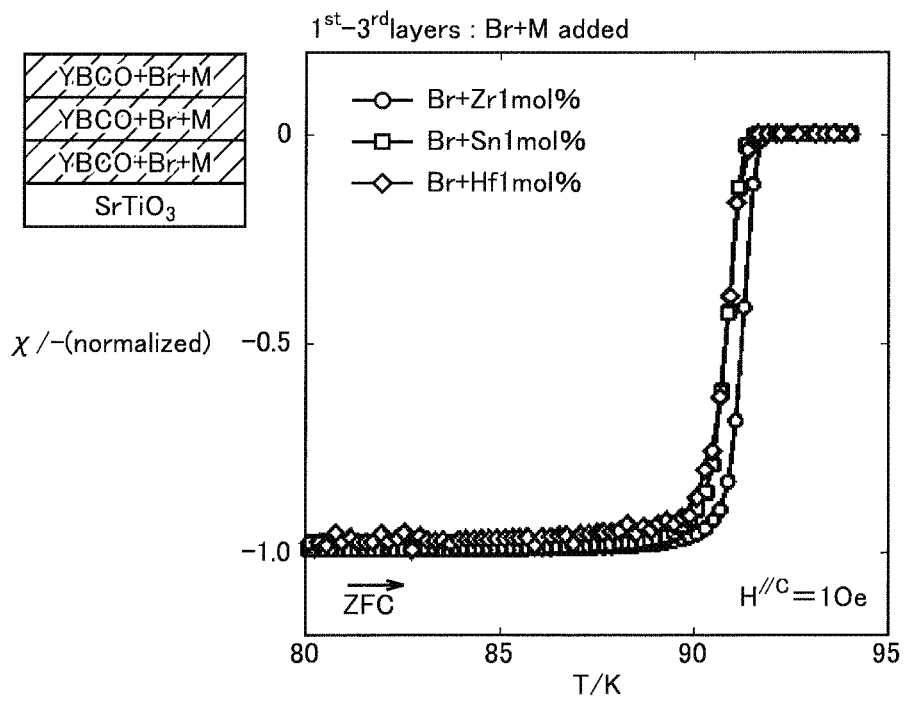
FIG. 11B shows a temperature dependency of a magnetic susceptibility in the YBCO oxide superconducting thin film according to each of Examples 4 to 6.

FIG. 11A shows the temperature dependency of magnetic susceptibility $\chi$ in each of the YBCO oxide superconducting thin films according to Examples 1 to 3, and FIG. 11B shows the temperature dependency of magnetic susceptibility $\chi$ in each of the YBCO oxide superconducting thin films according to Examples 4 to 6. In FIG. 11A and FIG. 11B, the vertical axis represents magnetic susceptibility $\chi$ (normalized), and the horizontal axis represents temperature (K).

With reference to FIG. 11A and FIG. 11B, it is understood that a high critical temperature Tc of more than 91 K was obtained in all of Examples 1 to 6. Moreover, it was confirmed that also in each of the Examples, when the temperature became less than or equal to critical temperature Tc, transition to the superconducting state was abruptly made. This indicates that even when either of Zr, Sn, and Hf is added, the temperature dependency of magnetic susceptibility $\chi$ is substantially unchanged and Tc is substantially unchanged.

Next, magnetic field dependency of critical current density Jc of each of the YBCO oxide superconducting thin films according to Examples 1 to 6 was measured at 77K and 40K. Results of the measurement of Jc are shown in FIG. 12A and FIG. 12B.

Figure 12A:
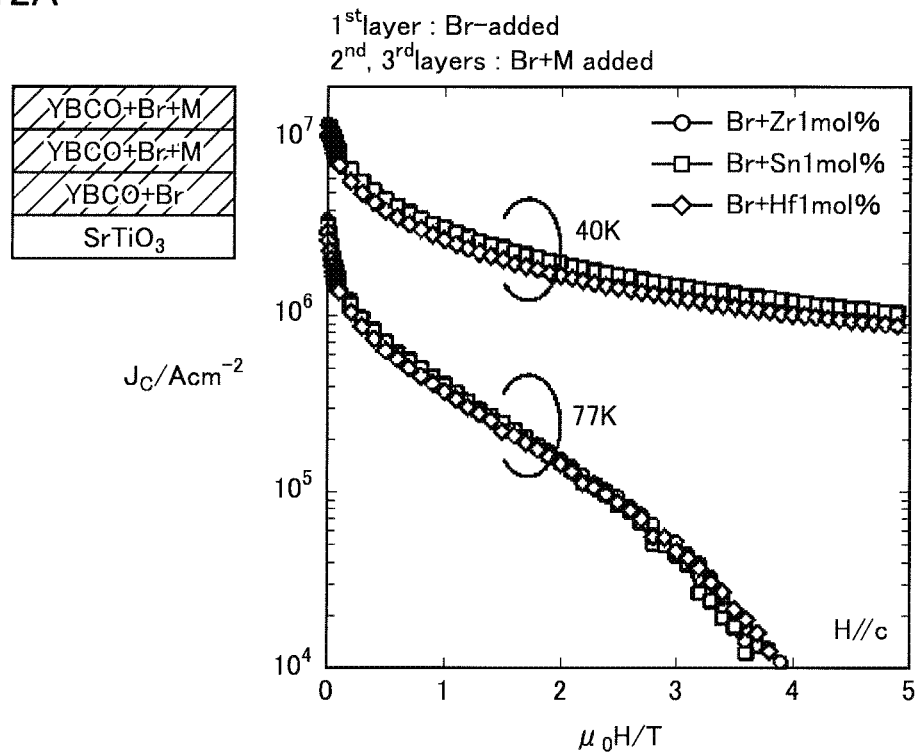
FIG. 12A shows a magnetic field dependency of Jc in the YBCO oxide superconducting thin film according to each of Examples 1 to 3.
Figure 12B:
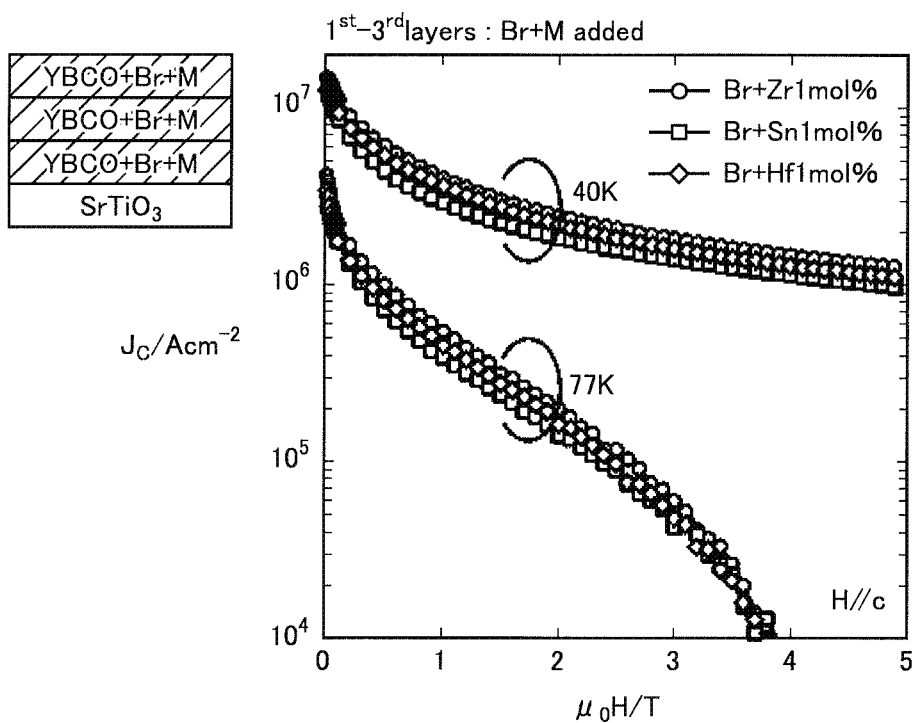
FIG. 12B shows a magnetic field dependency of Jc in the YBCO oxide superconducting thin film according to each of Examples 4 to 6.

In FIG. 12A and FIG. 12B, the vertical axis represents Jc $(A/cm^{-2})$, and the horizontal axis represents $\mu_0 H$ (T). FIG. 12A shows results of the measurement of Jc of the YBCO oxide superconducting thin films according to Examples 1 to 3, and FIG. 12B shows results of the measurement of Jc of the YBCO oxide superconducting thin films according to Examples 4 to 6.

Here, in comparison between the magnetic field dependency of Jc shown in FIG. 12A and the magnetic field dependency of Jc when M is not added as shown in FIG. 9, it is understood that Jc in the magnetic field is improved by adding both Br and M to the second layer and the third layer. Likewise, in comparison between FIG. 12B and FIG. 9, it is recognized that Jc is improved by adding both Br and M to the first layer to the third layer.

Further, in order to evaluate pinning forces of the Ba2342 crystals and the nano particles, a maximum pinning force density Fp,max was measured. It should be noted that in the case of 40 K, a pinning force density Fp at 4.8 T was employed because pinning force density Fp did not exhibit a maximum value in the measurement range.

Table 1 and Table 2 show results of the measurement of the superconducting properties of the YBCO oxide superconducting thin films according to Examples 1 to 6. It should be noted that as Comparative Example 1, Table 1 shows superconducting properties of the YBCO oxide superconducting thin film in which Br and M were not added. Moreover, as Example 7, Table 1 shows superconducting properties of the YBCO oxide superconducting thin film (see FIG. 7 for Experiment 2) in which only Br was added to the first layer to the third layer.

TABLE 1

| | | Tc (K) | Jc@77K 0T $(MAcm^{-2})$ | Jc@40K, 4T $(MAcm^{-2})$ | Fp,max@77K $(GNM^{-3})$ | Fp@40K, 4.8T $(GNM^{-3})$ |
|---|---|---|---|---|---|---|
| Comparative Example 1 | Not Added | 90.9 | 2.1 | 0.38 | 1.1 | 17 |
| Example 7 | Br Added | 91.3 | 2.4 | 0.70 | 2.2 | 30 |
| Example 1 | Br + Zr (Second and Third Layers) | 91.6 | 3.5 | 1.1 | 4.0 | 48 |
| Example 2 | Br + Sn (Second and Third Layers) | 91.5 | 3.2 | 1.2 | 4.0 | 51 |
| Example 3 | Br + Hf (Second and Third Layers) | 91.7 | 3.0 | 1.0 | 3.7 | 43 |

TABLE 2

| | | Tc (K) | Jc@77K, 0T $(MAcm^{-2})$ | Jc@40K, 4T $(MACM^{-2})$ | Fp, max@77K $(GNM^{-3})$ | Fp@40K, 4.8T $(GNm^{-3})$ |
|---|---|---|---|---|---|---|
| Example 4 | Br + Zr (First to Third Layers) | 91.7 | 4.2 | 1.5 | 5.4 | 62 |
| Example 5 | Br + Sn (First to Third Layers) | 91.5 | 3.5 | 1.1 | 3.9 | 48 |
| Example 6 | Br + Hf (First to Third Layers) | 91.5 | 3.4 | 1.3 | 4.6 | 54 |

As the superconducting properties of the YBCO oxide superconducting thin films according to Examples 1 to 7 and Comparative Example 1, Table 1 and Table 2 show the following measurement results: critical temperature Tc; critical current density Jc (MAcm$^{-2}$) in a zero magnetic field at 77 K; critical current density Jc (MAcm$^{-2}$) in a magnetic field (4 T) at 40 K; maximum pinning force density Fp,max (GNm$^{-3}$) at 77 K; and pinning force density Fp (GNm$^{-3}$) in a magnetic field (4.8 T) at 40 K.

Specifically, Table 1 collectively shows the superconducting properties of the YBCO oxide superconducting thin films according to Examples 1 to 3 and 7 and Comparative Example 1. With reference to Table 1, it is understood that higher Jc, Fp,max, and Fp were obtained in the case where Br was added (Example 7) as compared with a case where Br was not added (Comparative Example 1). This is presumably due to the following reason: as shown in Experiment 2, the excellent biaxial orientation structure of the YBCO oxide superconducting thin film is maintained by the $Ba_2Cu_3O_4Br_2$ crystals and the crystals function as pinning centers.

In the YBCO oxide superconducting thin film (Examples 1 to 3 and 7) in which Br was added, it is understood that by further adding M to the second layer and the third layer (Examples 1 to 3), Jc, Fp,max, and Fp were improved greatly as compared with the one in which M was not added to the second layer and the third layer (Example 7). Accordingly, it is considered that since the biaxial orientation structure of the YBCO oxide superconducting thin film is maintained by the Ba2342 crystals, pinning centers can be further introduced, thus contributing to improvement in Jc, Fp,max, and Fp.

Table 2 collectively shows the superconducting properties of the YBCO oxide superconducting thin films according to Examples 4 to 6. With reference to Table 1 and Table 2, it is understood that Jc, Fp,max, and Fp are further improved by adding both Br and M to the first layer to the third layer (Examples 4 to 6) as compared with the ones in each of which both Br and M are added to the second layer and the third layer (Examples 1 to 3).

As shown in FIG. 10, in each of the YBCO oxide superconducting thin films in which Br is added, the crystal orientation is not varied even when M is also added to the first layer. As a result, it is considered that further pinning centers can be introduced while maintaining the biaxial orientation structure of the YBCO oxide superconductor thin film, whereby Jc, Fp,max, and Fp are improved further.

<Experiment 4> (Comparison with Addition of Cl and M)

Finally, the effect of adding both Br and M to the source-material solution as shown in Experiment 3 was compared with an effect of adding both Cl and M to the source-material solution.

In the present experiment, by adding Cl and M to the source-material solution, $BaMO_3$ nano particles were introduced to each of YBCO oxide superconducting thin films. Specifically, each YBCO oxide superconducting thin film having a three-layer configuration, having a film thickness of 0.4 μm, and having a film composition of $YBa_{2.1}Cu_{3.15}M_2Cl_{0.1}O_y$, was sintered at 800° C. for 60 min under $PO_2$=10 Pa. As impurity metal M, Zr, Hf, or Sn was used and an amount of addition of M to the source-material solution was 1 mol % in each case. It should be noted that an average film composition when both Cl and M are added to the second layer and the third layer is $YBa_{2.1}Cu_{3.15}M_{0.007}Cl_{0.1}O_y$, and an average film composition when both Cl and M are added to the first to third layers is $YBa_{2.1}Cu_{3.15}M_{0.01}Cl_{0.1}O_y$.

Figure 13:
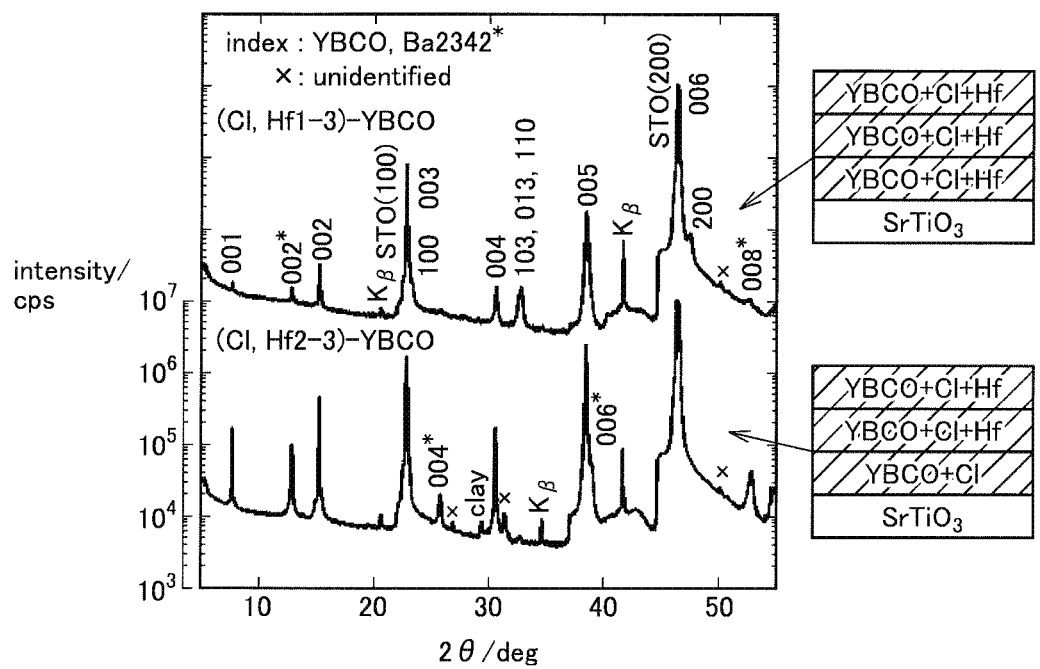
FIG. 13 shows an XRD pattern of a YBCO oxide superconducting thin film in which both Cl and Hf are added.

Each of the produced YBCO oxide superconducting thin films was subjected to XRD measurement. The XRD measurement method is the same as the method used in Experiment 3. FIG. 13 shows: an XRD pattern of a YBCO oxide superconducting thin film in which Cl and Hf are added to the second layer and the third layer; and an XRD pattern of a YBCO oxide superconducting thin film in which Cl and Hf are added to the first to third layers. In FIG. 13, the vertical axis represents diffraction intensity (cps) and the horizontal axis represents 2θ (deg).

With reference to FIG. 13, it was confirmed that when both Cl and Hf were added to the first layer, the peak of the YBCO (103) plane appeared in the XRD pattern and the crystal orientation was greatly varied. On the other hand, it was confirmed that when Hf was not added to the first layer and was added only to the second layer and the third layer, the variation of the crystal orientation was suppressed. Thus, regarding the addition of Cl and M, it is considered that the c-axis orientation of the YBCO oxide superconducting thin film is suppressed significantly when Cl and M are added to the first layer.

Therefore, in the present experiment, as Comparative Examples 2 to 5, the following YBCO oxide superconducting thin films were produced: a YBCO oxide superconducting thin film in which only Cl was added to the first to third layers (Comparative Example 2); a YBCO oxide superconducting thin film in which Cl and Zr were added to the second and third layers (Comparative Example 3); a YBCO oxide superconducting thin film in which Cl and Sn were added to the second and third layers (Comparative Example 4); and a YBCO oxide superconducting thin film in which Cl and Hf were added to the second and third layers (Comparative Example 5).

Table 3 shows results of measurement of superconducting properties of the YBCO oxide superconducting thin films according to Comparative Examples 2 to 5. It should be noted that as Comparative Example 1, Table 3 shows the superconducting properties (Tc, Jc, Fp,max, Fp) of a YBCO oxide superconducting thin film in which Cl and M are not added.

TABLE 3

|  |  | Tc (K) | Jc@77K 0T (MAcm$^{-2}$) | Jc@40K, 4T (MAcm$^{-2}$) | Fp, max@77K (GNm$^{-3}$) | Fp@40K, 4.8T (GNm$^{-3}$) |
|---|---|---|---|---|---|---|
| Comparative Example 1 | Not Added | 90.9 | 2.1 | 0.38 | 1.1 | 17 |
| Comparative Example 2 | Cl Added | 91.7 | 2.4 | 0.58 | 1.8 | 26 |
| Comparative Example 3 | Cl + Zr (Second and Third Layers) | 91.4 | 2.5 | 0.81 | 2.6 | 35 |

TABLE 3-continued

|  |  | Tc (K) | Jc@77K 0T (MAcm$^{-2}$) | Jc@40K, 4T (MAcm$^{-2}$) | Fp, max@77K (GNm$^{-3}$) | Fp@40K, 4.8T (GNm$^{-3}$) |
|---|---|---|---|---|---|---|
| Comparative Example 4 | Cl + Sn (Second and Third Layers) | 91.7 | 2.6 | 0.74 | 2.2 | 33 |
| Comparative Example 5 | Cl + Hf (Second and Third Layers) | 91.2 | 2.4 | 0.85 | 2.7 | 36 |

With reference to Table 3, it is understood that higher Jc, Fp,max, and Fp were obtained by adding Cl (Comparative Example 2), as compared with a case where Cl was not added (Comparative Example 1). This is presumably due to the following reason: since the $Ba_2Cu_3O_4Cl_2$ crystals are formed by adding Cl, the biaxial orientation structure of the YBCO oxide superconducting thin film is maintained and the crystals function as pinning centers.

Further, it is understood that by adding Cl and M to the second layer and the third layer (Comparative Examples 3 to 5), Jc, Fp,max, and Fp were improved greatly as compared with the one in which M was not added to the second layer and the third layer (Comparative Example 2). This indicates that the effect of improving Jc is obtained by adding both Cl and M as with the case where both Br and M are added as described above.

Here, in comparison between Example 7 and Comparative Example 2, by adding Br to the YBCO oxide superconducting thin film, Jc, Fp,max, and Fp are higher than those in the YBCO oxide superconducting thin film in which Cl is added.

Further, in comparison between Examples 1 to 3 and Comparative Examples 3 to 5, it is understood that by adding both Br and M to the second layer and the third layer of the YBCO oxide superconducting thin film, Jc, Fp,max, and Fp are higher than those in the YBCO oxide superconducting thin film in which Cl and M are added to the second layer and the third layer.

This presumably indicates that the $Ba_2Cu_3O_4Br_2$ crystals formed when Br is added provide a higher effect of promoting the biaxial orientation of the oxide superconductor crystal than that in the case of the $Ba_2Cu_3O_4Cl_2$ crystals formed when Cl is added. Moreover, it is presumed that the $Ba_2Cu_3O_4Br_2$ crystals function more effectively as pinning centers than the $Ba_2Cu_3O_4Cl_2$ crystals. Further, it is presumed that by adding Br, the $BaMO_3$ nano particles are introduced into the YBCO oxide superconducting thin film more effectively as compared with the one in which Cl is added. In view of the above, it is suggested that as compared with the addition of Cl, the addition of Br is more excellent in terms of a capability of assisting the biaxial orientation growth of the oxide superconductor crystal and is more effective in terms of introduction of the pinning centers.

Furthermore, as described with reference to FIG. 10B, in the case of the addition of both Br and M, the variation of the crystal orientation can be suppressed even when M is added to the first layer of the YBCO oxide superconducting thin film having the three-layer configuration. Therefore, as compared with the addition of both Cl and M, it is presumed that a higher effect of improving Jc can be obtained.

It should be noted that according to Experiments 3 and 4, it was confirmed that Jc, Fp,max, and Fp are the highest in the YBCO oxide superconducting thin film according to Example 4 among the YBCO oxide superconducting thin films according to Examples 1 to 7 and Comparative Examples 1 to 5. In view of the above, it is suggested that the YBCO oxide superconducting thin film in which both Br and Zr are added to the first to third layers exhibits the effect of the present invention significantly.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: $Ba_2Cu_3O_4Br_2$ crystal (Ba2342 crystal); 2: metal substrate; 3: intermediate layer; 4: oxide superconducting thin film; 5: protective layer; 6: stabilization layer; 10: oxide superconducting wire

The invention claimed is:

1. An oxide superconducting thin film material comprising:
a metal substrate having a surface with a biaxially oriented crystal orientation structure;
an intermediate layer biaxially oriented and formed on the metal substrate; and
an oxide superconducting thin film formed on the intermediate layer and composed of a RE123-based oxide superconductor represented by $REBa_2Cu_3O_y$, where RE represents a rare earth element, Ba represents barium, Cu represents copper, and O represents oxygen, wherein
the oxide superconducting thin film includes Br (bromine),
the oxide superconducting thin film has a deposit formed on a surface of the intermediate layer or in the oxide superconducting thin film, and
the deposit includes a $Ba_2Cu_3O_4Br_2$ crystal.

2. The oxide superconducting thin film material according to claim 1, wherein the $Ba_2Cu_3O_4Br_2$ crystal formed on the surface of the intermediate layer has an upper surface and a side surface that constitute a three-dimensional template assisting biaxial orientation growth of the oxide superconducting thin film.

3. The oxide superconducting thin film material according to claim 1, further comprising a $BaMO_3$ nano particle formed in the oxide superconducting thin film, where M represents an impurity metal, wherein
M is one of Hf (hafnium), Zr (zirconium), Sn (tin), Nb (niobium), Ir (iridium), Ti (titanium), Ce (cerium) and Bi (bismuth).

4. An oxide superconducting wire comprising:
the oxide superconducting thin film material recited in claim 1; and
a coating layer that coats at least the oxide superconducting thin film.

* * * * *